United States Patent
Wang

(10) Patent No.: US 7,419,837 B2
(45) Date of Patent: Sep. 2, 2008

(54) METHOD OF MANUFACTURING SEMICONDUCTOR DEVICE

(75) Inventor: Wensheng Wang, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 317 days.

(21) Appl. No.: 11/443,136

(22) Filed: May 31, 2006

(65) Prior Publication Data

US 2006/0214208 A1    Sep. 28, 2006

Related U.S. Application Data

(63) Continuation of application No. PCT/JP2004/001912, filed on Feb. 19, 2004.

(51) Int. Cl.
*H01L 21/00* (2006.01)
(52) U.S. Cl. .......................... 438/3; 438/240
(58) Field of Classification Search .......... 438/3, 438/240, 250, 393
See application file for complete search history.

(56) References Cited

U.S. PATENT DOCUMENTS

| | | | |
|---|---|---|---|
| 5,443,030 A | | 8/1995 | Ishihara et al. |
| 2003/0089954 A1 | | 5/2003 | Sashida |
| 2005/0136554 A1* | | 6/2005 | Okita et al. ............... 438/3 |
| 2006/0199342 A1* | | 9/2006 | Matsuura et al. ........... 438/291 |

FOREIGN PATENT DOCUMENTS

| | | |
|---|---|---|
| JP | 5-206382 A | 8/1993 |
| JP | 5-251351 A | 9/1993 |
| JP | 2002-305289 A | 10/2002 |
| JP | 2003-152165 A | 5/2003 |
| JP | 2003-347512 A | 12/2003 |

OTHER PUBLICATIONS

International Search Report mailed Jun. 1, 2004 of International Application PCT/JP2004/001912.
Notification of Transmittal of Copies of Translation of the International Preliminary Report on Patentability (Form PCT/IB/338) of International Application No. PCT/JP2004/001912 mailed Sep. 28, 2006 with Forms PCT/IB/373 and PCT/ISA/237.

* cited by examiner

*Primary Examiner*—Tuan H Nguyen
(74) *Attorney, Agent, or Firm*—Westerman, Hattori, Daniels & Adrian, LLP.

(57) ABSTRACT

A Pt film (24), a PLZT film (25), and a top electrode film (26) are formed above a semiconductor substrate (11). Next, the top electrode film (26) is patterned. Then, a PLZT film (27) covering an exposed portion of the PLZT film (25) is formed as an evaporation preventing film. Then, heat treatment is performed in an oxidative atmosphere to recover damage sustained to the PLZT film (25). Heat treatment is not performed between patterning of the top electrode film (26) and formation of the PLZT film (27). Thereafter, a ferroelectric capacitor is formed by patterning the PLZT film (25) and the Pt film (24).

19 Claims, 8 Drawing Sheets

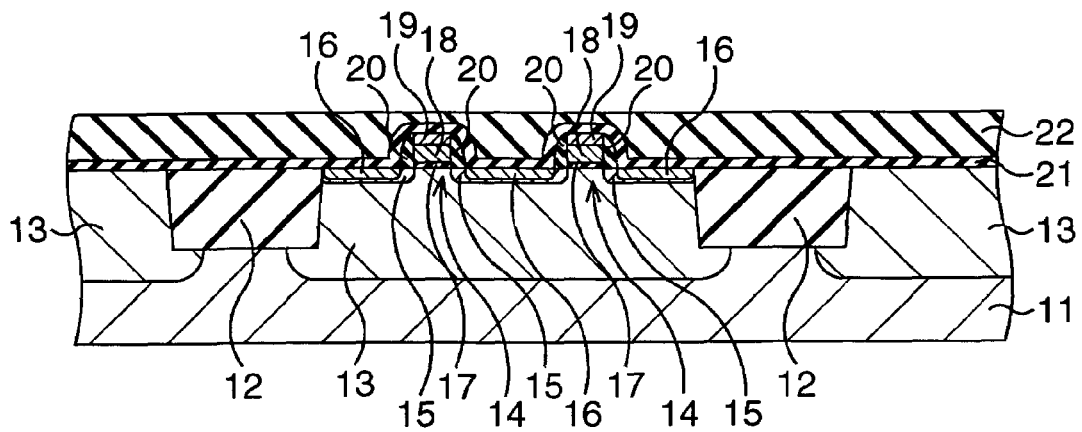
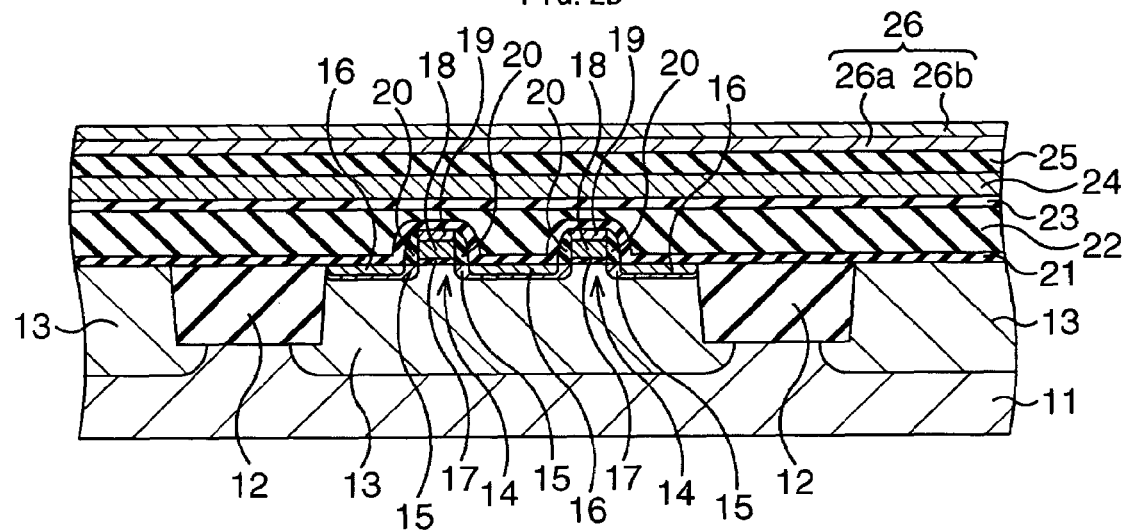
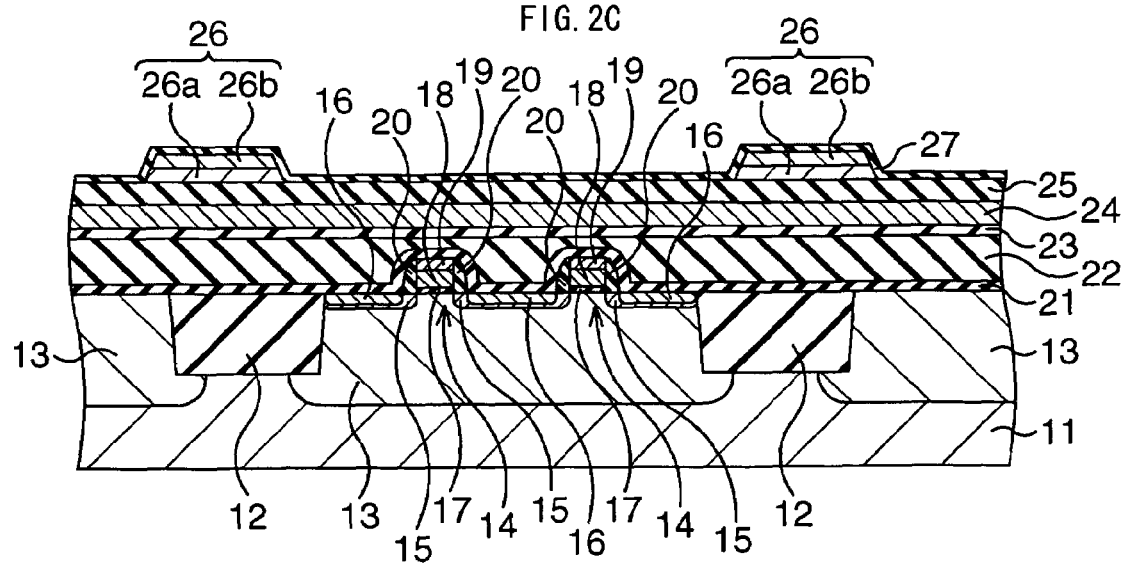

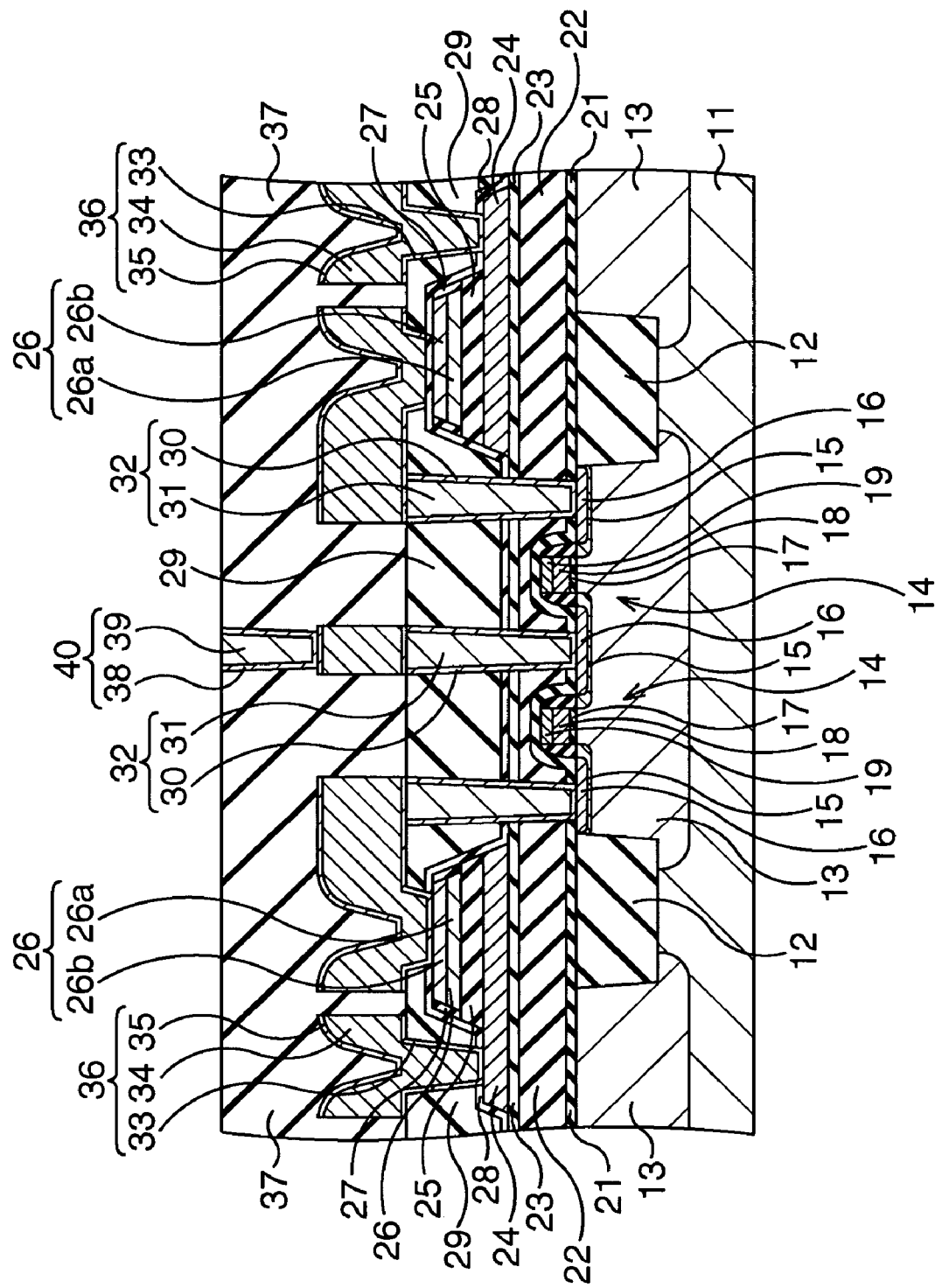

METHOD OF MANUFACTURING SEMICONDUCTOR DEVICE

This application is a continuation of international application PCT/JP2004/001912 filed on Feb. 19, 2004.

TECHNICAL FIELD

The present invention relates to a method of manufacturing a semiconductor device suitable for manufacturing a ferroelectric capacitor.

BACKGROUND ART

In recent years, as digital technology has progressed, it has become increasingly common to process or store large amount of data at high speed. Accordingly, there is demand for highly integrated, high performance semiconductor device for use in electronic devices.

Accordingly, in order to realize high integration of semiconductor storage devices (DRAM), extensive research and development have been carried out for a technology using a ferroelectric material or a high dielectric constant material instead of a silicon oxide or a silicic acid nitride as a capacitor insulating film of a capacitor element constituting DRAM.

Furthermore, in order to realize a non-volatile RAM which can perform both write and read operation at low voltage and high speed, active research and development have been made for a ferroelectric memory (FeRAM) using a ferroelectric film having a spontaneous polarization characteristic as a capacitor insulating film.

Ferroelectric memory (FeRAM) stores information utilizing a hysteresis characteristic of the ferroelectric. In ferroelectric memory, ferroelectric capacitors having a ferroelectric film are provided for each memory cell as a capacitor dielectric film between a pair of electrodes. Polarization occurs according to applied voltage between electrodes in the ferroelectric material, and after the applied voltage is removed, a spontaneous polarization still remains. When the polarity of the applied voltage is reversed, the polarity of the spontaneous polarization also reverses. Accordingly, if spontaneous polarization is detected, information can be read out. Furthermore, when compared with flash memory, ferroelectric memory can operate under a low voltage, which makes it possible to write at high speed at a power-thrifty state.

The ferroelectric film used in FRAM is formed from a PZT series material such as lead zirconium titanate (PZT), La doped PZT (PLZT) or the like, a Bi-layer structured compound or the like such as $SrBi_2Ta_2O_9$ (SBT, Y1), $SrBi_2(Ta, Nb)_2O_9$ (SBTN, YZ) or the like.

Conventionally, a sol-gel method or a sputtering method has been used as a film formation method of a ferroelectric thin film. By these film formation methods, an amorphous phase ferroelectric film is formed above a bottom electrode film, and then, the ferroelectric film is crystallized into a Perovskite structured crystal by heat treatment. After the crystallization of the ferroelectric film, a top electrode film is formed. During this stage, the ferroelectric film is vulnerable to physical damage mainly by high energy sputtering particles at this time. As a result of such damage, a portion of the ferroelectric film crystal structure may be destroyed and the characteristics of the capacitor element are caused to deteriorate.

Therefore, in order to recover such deterioration of capacitor element characteristics, treatment like the following has been conventionally carried out. In a first conventional method, heat treatment is carried out in an oxygen atmosphere after patterning the top electrode film. In a second conventional method, heat treatment is carried out in an oxygen atmosphere after patterning the top electrode film and the ferroelectric film. In a third conventional method, heat treatment is carried out in an oxygen atmosphere after forming a capacitor element by patterning. In these treatments, oxygen recovers the crystallinity of the ferroelectric film.

Furthermore, in a conventional method, after formation of the capacitor element, an aluminum oxide film covering the capacitor element is formed as a diffusion preventing film to prevent the ferroelectric film from hydrogen deterioration. Consequently, in order to recover damage to the ferroelectric film sustained during patterning and during formation of the diffusion preventing film, heat treatment is again carried out in the oxygen atmosphere. Thereafter, an interlayer insulating film is formed.

Another method is disclosed in Patent Document 1 (Japanese Patent Application Laid-open No. Hei 5-251351). In the method disclosed in Patent Document 1, various types of heat treatment are carried out on the ferroelectric film in the oxygen atmosphere, aiming at obtaining a ferroelectric film having no oxygen holes, no generation of leakage current even by applying an electric field, and maintaining a dielectric constant. As the heat treatment, a method of irradiating ultraviolet rays to ozone or oxygen gas, heat treatment in an oxygen atmosphere under high pressure, and heat treatment using ozone gas can be cited.

Still another method is disclosed in Patent Document 2 (Japanese Patent Application Laid-open No. 2002-305289). In the method disclosed in Patent Document 2, by forming a PZT film which contains more Pb in compositional ratio than the PZT film as the capacitor insulating film after heat treatment to recover from damage to a ferroelectric capacitor, a side wall film is formed above a side surface of the ferroelectric capacitor. Due to such a side wall insulating film, the influence of hydrogen, $H_2O$ and the like existing in a TEOS film which is formed thereafter, is reduced so that deterioration of the PZT film characteristics is reduced.

However, even with the above-described methods, a ferroelectric capacitor having a sufficient characteristic cannot be obtained.

For instance, with the method disclosed in Patent Document 1, since crystal orientation of the obtained ferroelectric film is low, residual polarization is low.

With the method disclosed in Patent Document 2, when performing heat treatment to recover from damage to the ferroelectric capacitor, element having the highest vapor pressure moves out from an exposed portion of the ferroelectric film, and pin holes are formed in the ferroelectric film. In other words, when the PZT film is used, Pb loss comes out. Such Pb loss lowers a switching characteristic of the ferroelectric capacitor, and lowers an initial characteristic and retention. The occupation rate of the exposed portion where such loss occurs to the whole ferroelectric capacitor increases as the semiconductor integrated circuit becomes finer and finer. Accordingly, problems caused by such loss have been manifested recently. Furthermore, as the occupation rate increases, it becomes difficult to uniformly correct the Pb loss even when later forming a side wall film made from a PZT having plenty of Pb.

Moreover, with the method disclosed in Patent Document 2, due to the existence of the side wall film, a composition in the capacitor insulating film is easy to become uneven. Accordingly, the switching electric charge is apt to be lowered and imprint is apt to occur.

Patent Document 1
Japanese Patent Application Laid-open No. Hei 5-251351
Patent Document 2
Japanese Patent Application Laid-open No. 2002-305289

SUMMARY OF THE INVENTION

An object of the present invention is to provide a method of manufacturing a semiconductor device which can improve compositional evenness of the insulating film of a ferroelectric capacitor.

In a method of manufacturing the semiconductor device according to the present invention, after forming a laminate composed of a bottom electrode film which is a raw material film of a bottom electrode, a ferroelectric film which is a raw material film of a capacitor insulating film, and a top electrode film which is a raw material film of a top electrode, of a ferroelectric capacitor, at least the top electrode film is patterned. Next, an evaporation preventing film is formed. The evaporation preventing film covers at least an exposed portion of the ferroelectric film and contains the same elements as that of the ferroelectric film. Then, damage to the ferroelectric film is recovered by heat treatment in an oxidative atmosphere. It should be noted that heat treatment is not performed between a step of patterning the top electrode film and a step of forming the evaporation preventing film.

BRIEF DESCRIPTION OF THE DRAWINGS

FIGS. 2A to 2F are sectional views showing a method of manufacturing the ferroelectric memory (semiconductor device) according to a first embodiment of the present invention;

DETAILED DESCRIPTION OF THE PREFERRED EMBODIMENTS

Figure 1:
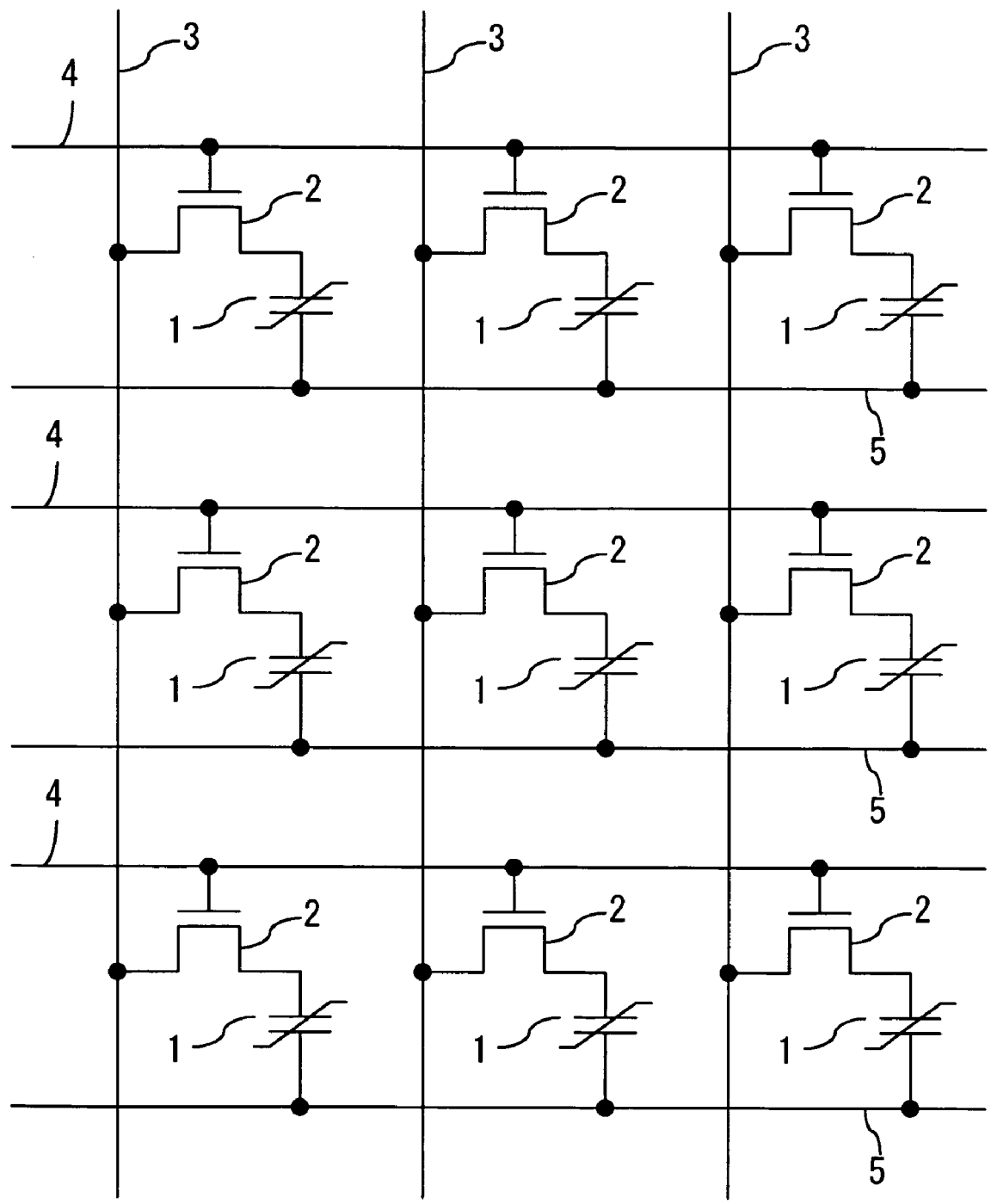
FIG. 1 is a circuit diagram showing a structure of a memory cell array of a ferroelectric memory (semiconductor device) manufactured by a method according to an embodiment of the present invention.

Hereinafter, embodiments of the present invention will be explained concretely with reference to the attached drawings. FIG. 1 is a circuit diagram showing a structure of a memory cell array of a ferroelectric memory (semiconductor device) manufactured by a method according to an embodiment of the present invention.

Multiple bit lines 3 extending in one direction, multiple word lines 4 and plate lines 5 extending orthogonally to the extending direction of the bit lines 3 are provided in the memory cell array. Further, plural memory cells of the ferroelectric memory according to the present embodiment are arranged in an array so as to match to the lattice composed of these bit lines 3, word lines 4, and the plate lines 5. Ferroelectric capacitors 1 and MOS transistors 2 are provided in the respective memory cells.

The gates of the MOS transistors 2 are connected to the word lines 4. A source/drain on one side of the MOS transistor 2 is connected to the bit line 3 and the other source/drain is connected to one end of the electrode of the ferroelectric capacitor 1. The other electrode of the ferroelectric capacitor 1 is connected to the plate line 5. Note that the respective word lines 4 and the plate lines 5 are held in common by the plurality of MOS transistors 2 lined in the same direction as the direction these lines extend. Similarly, the respective bit lines 3 are held by plural pieces of the MOS transistors 2 lined in the same direction as the direction the bit lines 3 extend. The direction toward which the word lines 4 and the plate lines 5 extend, and the direction toward which the bit lines 3 extend, are sometimes called a line direction and a row direction respectively.

In the memory cell array of the ferroelectric memory thus structured, data are stored according to the polarization state of a ferroelectric film provided in the ferroelectric capacitor 1.

First Embodiment

The first embodiment of the present invention will be explained next. FIGS. 2A to 2F are sectional views showing a method of manufacturing the ferroelectric memory (semiconductor device) according to the first embodiment of the present invention in process order. Note that in FIGS. 2A to 2F, a portion corresponding to two pieces of the MOS transistors holding one bit lines (corresponding to the bit line 3 in FIG. 1) in common is shown.

In the first embodiment, first, as shown in FIG. 2A, element separation regions 12 and wells 13 are formed on the surface of the semiconductor substrate 11 of a silicon substrate or the like. Then, gate insulating films 17, gate electrodes 18, cap films 19, side walls 20, source/drain diffusion layers 15, and silicide layers 16 are formed on the surface of the well 13 so as to form MOS transistors 14 as switching elements. The MOS transistors 14 correspond to the MOS transistors 2 in FIG. 1. Note that two source/drain diffusion layers 15 are formed for the source and drain in the respective MOS transistors 14, and one of them is held in common by the two MOS transistors 14.

Next, a silicon oxynitride film 21 is formed over the entire surface so as to cover the MOS transistors 14, then a $SiO_2$ film 22 is formed over the entire surface as an interlayer insulating film, and the $SiO_2$ film 22 is flattened with a CMP (chemical mechanical polishing) or the like. The silicon oxynitride film 21 is formed to prevent the gate insulating films 17 and the like from hydrogen deterioration when forming the $SiO_2$ film 22. Then, degassing of mainly $SiO_2$ 22 is carried out by annealing for 30 minutes at 650° C. in a nitrogen gas atmosphere.

Thereafter, as shown in FIG. 2B, an aluminum oxide film 23 is formed above the $SiO_2$ film 22 as a bottom electrode adhesion layer by a sputtering method. The thickness of the aluminum oxide film 23 is set to be, for example, about 20 nm. As the bottom electrode adhesion layer, a titanium film or $TiO_x$ film of about 20 nm in thickness may be formed. Then, a platinum film 24 is formed above the aluminum oxide film 23 as the bottom electrode film by a sputtering method. The thickness of the platinum film 24 is set to be, for instance, about 150 nm.

Then, a PLZT film 25 is formed as the ferroelectric film above the Pt film 24 in an amorphous state by a sputtering method. Next, the PLZT film 25 is heat treated at 600° C. or lower in an atmosphere containing Ar and $O_2$ by an RTA (Rapid Thermal Annealing) method. As a result, the PLZT film 25 is crystallized, and at the same time, the Pt film 24 is closely packed, and mutual diffusion of Pt and O in the vicinity of a boundary surface between the Pt film 24 and the PLZT film 25 is restrained.

Thereafter, an $IrO_x$ film 26a ($1 \leq x \leq 2$) is formed above the PLZT film 25 as a portion of the top electrode film by a sputtering method. The thickness of the $IrO_x$ film 26a is set to be about 50 nm, for example. Then, heat treatment is carried out by an RTA method. As a result, the PLZT film 25 is completely crystallized, and at the same time, a very small quantity of Ir is diffused from the $IrO_x$ film 26a to the PLZT film 25, and the electric characteristic of the ferroelectric capacitor is improved. Next, an $IrO_x$ film 26b is formed on the $IrO_x$ film 26a as the other portion of the top electrode film by a sputter method. The thickness of the $IrO_x$ film 26b is set to be about 200 nm, for example. A top electrode film 26 is formed of the $IrO_x$ film 26a and the $IrO_x$ film 26b. Next, the back (reverse side) of the semiconductor substrate (wafer) 11 is washed.

Thereafter, as shown in FIG. 2C, the top electrode of the ferroelectric capacitor is formed from the top electrode film 26 by patterning the $IrO_x$ film 26a and the $IrO_x$ film 26b. Then, a PLZT film 27 covering the top electrode film 26 and the PLZT film 25 is formed by a sputtering method as an evaporation preventing film to prevent Pb in the PLZT film 25 from evaporating. The thickness of the PLZT film 27 is set to be, for example, about 20 nm to 50 nm. Then, the PLZT film 27 is crystallized by heat treatment. Note that the crystallization annealing can be omitted.

Then, recovery annealing is carried out to recover the characteristic of the PLZT film 25 in a state such that the PLZT film 25 is covered with the PLZT film 27. The recovery annealing is carried out, for example, for 60 minutes at 650° C. in an $O_2$ atmosphere. By this recovery annealing, damage sustained to the PLZT film 25 during formation of the top electrode film 26 and patterning thereof is recovered. At this time, although Pb may evaporate from the PLZT film 27, there is no evaporation of Pb from the PLZT film 25, and the compositional uniformity in the PLZT film 25 can be maintained. Note that as an atmosphere for the recovery annealing, an oxidative atmosphere is sufficient; there is no need for an oxygen gas atmosphere. The recovery annealing is preferably performed at 600° C. to 700° C.

Figure 2D:
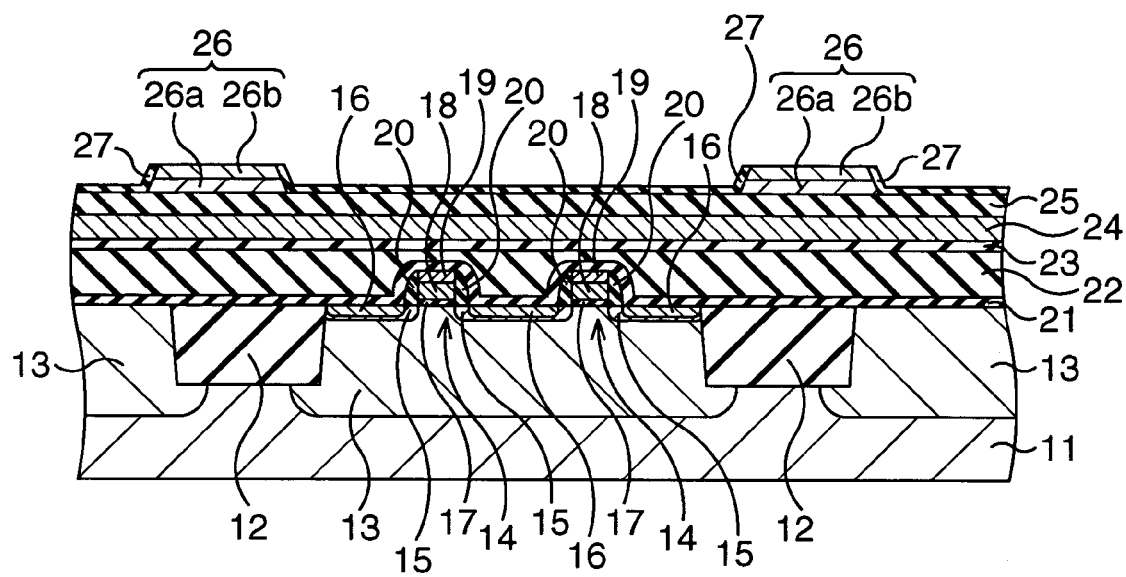

After the recovery annealing, as shown in FIG. 2D, the portion on the top electrode of the PLZT film 27 is removed by patterning the PLZT film 27. At this time, all of the PLZT film 27 may be removed by performing whole surface etch back.

Figure 2E:
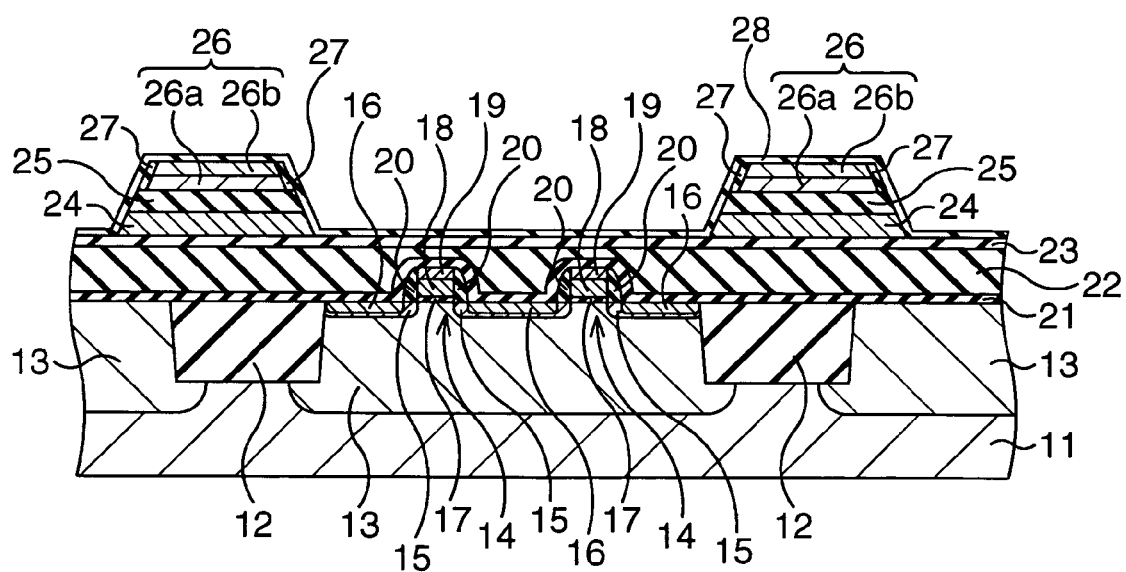

Next, as shown in FIG. 2E, the capacitor insulating film of the ferroelectric capacitor is formed from the PLZT film 25 by patterning the PLZT film 25. At this time, the PLZT film 27 is also patterned. Further, by patterning the Pt film 24, the bottom electrode of the ferroelectric capacitor is formed from the Pt film 24. The ferroelectric capacitor is formed in this manner. The ferroelectric capacitor corresponds to the ferroelectric capacitor 1 in FIG. 1. After that, in order to restrain hydrogen deterioration of the PLZT film 25, an aluminum oxide film 28 is formed as a diffusion preventing film to prevent hydrogen from diffusing into the PLZT film 25 from outside. The thickness of the aluminum oxide film 28 is, for example, about 50 nm in the case of forming by a sputtering method, and about 20 nm to about 50 nm in the case of forming by an MOCVD method because coverage is better.

Thereafter, as shown in FIG. 2F, an interlayer insulating film 29 is formed over the entire surface, and the surface thereof is made flat. Then, contact holes reaching the silicide layers 16 of the MOS transistors 14 are formed. And conductive plugs 32 are formed by burying barrier metal films 30 and W films 31. Next, contact holes reaching the top electrodes of the ferroelectric capacitors and contact holes reaching the bottom electrodes thereof are formed. Then, wirings 36 including barrier metal films 33, Al films 34, and barrier metal films 35 are formed inside the contact holes and above the interlayer insulating film 29. A part of the wirings 36 which are connected to the bottom electrodes function a part of the plate lines 5 in FIG. 1. Moreover, an interlayer insulating film 37 is formed over the entire surface. Then, a contact hole reaching the conductive plug 32 which is connected to the silicide layer 16 above the diffusion layer 15 which is owned jointly by the two MOS transistors 14 is formed in the interlayer insulating film 37. And by burying a barrier metal film 38 and a W film 39 in this contact hole, a conductive plug 40 is formed. The conductive plug 40 functions a part of the bit line 3 in FIG. 1.

Thereafter, upper wirings and upper interlayer insulating films are formed, and so on. Then, a cover film including, for example, a TEOS film and an SiN film is formed to accomplish a ferroelectric memory having a ferroelectric capacitor.

According to the first embodiment as above, since recovery annealing of the PLZT film 25 containing volatile Pb is carried out in a state such that the PLZT film 25 is covered with the PLZT film 27, Pb loss of the PLZT film 25 is not created. Accordingly, the uniformity of the composition is maintained, and a favorable characteristic can be obtained.

Whereas, in a conventional method, since recovery annealing is carried out in a state such that a portion of the ferroelectric film forming the ferroelectric capacitor is exposed, Pb evaporates partially from a portion to be a capacitor insulating film of the ferroelectric film, resulting in deviation of the composition of the capacitor insulating film. Furthermore, the evaporation of Pb accompanies a lowering of the ferroelectric characteristic. Note that if heat treatment is carried out at lower than 400° C., it may be possible to prevent evaporation of Pb, but damage to the ferroelectric film cannot be recovered at this temperature. Further, even with a method to perform recovery annealing in a state such that the capacitor insulating film is covered with an aluminum oxide film, since Pb in the capacitor insulating film is accumulated near the interface with the aluminum oxide film so that a portion lower in Pb concentration than other portions is created, the uniformity in composition is lowered.

Here, regarding the first embodiment, results of experiments actually performed by the present inventor will be explained.

First Experiment

In the first experiment, samples were prepared according to six methods. A planar shape of the ferroelectric capacitor was set to be a square 50 μm on a side. A ferroelectric capacitor of this size (discrete) is generally not used for a memory cell, but is used for a smoothing circuit.

In forming a first sample (sample No. 1), an aluminum oxide film of 50 nm in thickness was formed as a diffusion preventing film covering the ferroelectric capacitor after forming the ferroelectric capacitor by patterning the top electrode film, the PLZT film and the bottom electrode in sequence. Next, recovery annealing was performed for 60 minutes at 650° C. in an oxygen atmosphere. Then, the portion on the top electrode of the aluminum oxide film was etched back. Thereafter, wiring was formed similarly to the first embodiment. A second sample (sample No. 2) was prepared similarly to the first sample except that an aluminum oxide film of 20 nm in thickness was formed as a diffusion preventing film. A third sample (sample No. 3) was prepared similarly to the first sample except omitting etch back treatment performed when forming the first sample. A fourth sample (sample No. 4) was prepared similarly to the first sample except that a PLZT film of 50 nm in thickness was formed as an evaporation preventing film instead of the diffusion preventing film. A fifth sample (sample No. 5) was prepared similarly to the first sample except that a PLZT film of 20 nm in thickness was formed as an evaporation preventing film instead of the diffusion preventing film. A sixth sample (sample No. 6) was prepared similarly to the first sample except that the order of performing recovery annealing and formation of the aluminum oxide film was transposed. Among these samples, sample No 4 and sample No. 5 relate to the embodiments of the present invention and other samples are comparative examples.

Then, the switching charge amount Qsw at the time of the applied voltage to the ferroelectric capacitor was 3V and the leakage current at the time of the applied voltage to the ferroelectric capacitor was +5 V were measured for these samples. The measurements were performed 40 times per sample (one wafer). Here, a positive applied voltage indicates that the potential of the bottom electrode was made higher than the potential of the top electrode. These results are shown in FIG. 3 and FIG. 4.

Figure 3:
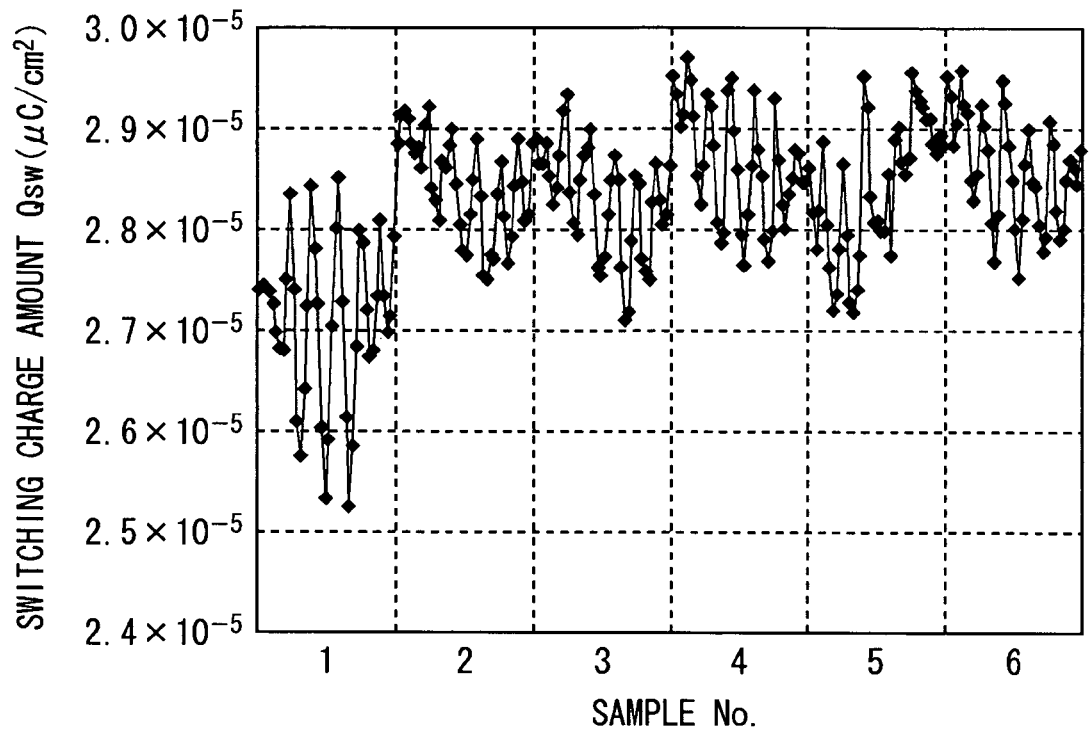
FIG. 3 is a graph showing an amount of switching electric charge.
Figure 4:
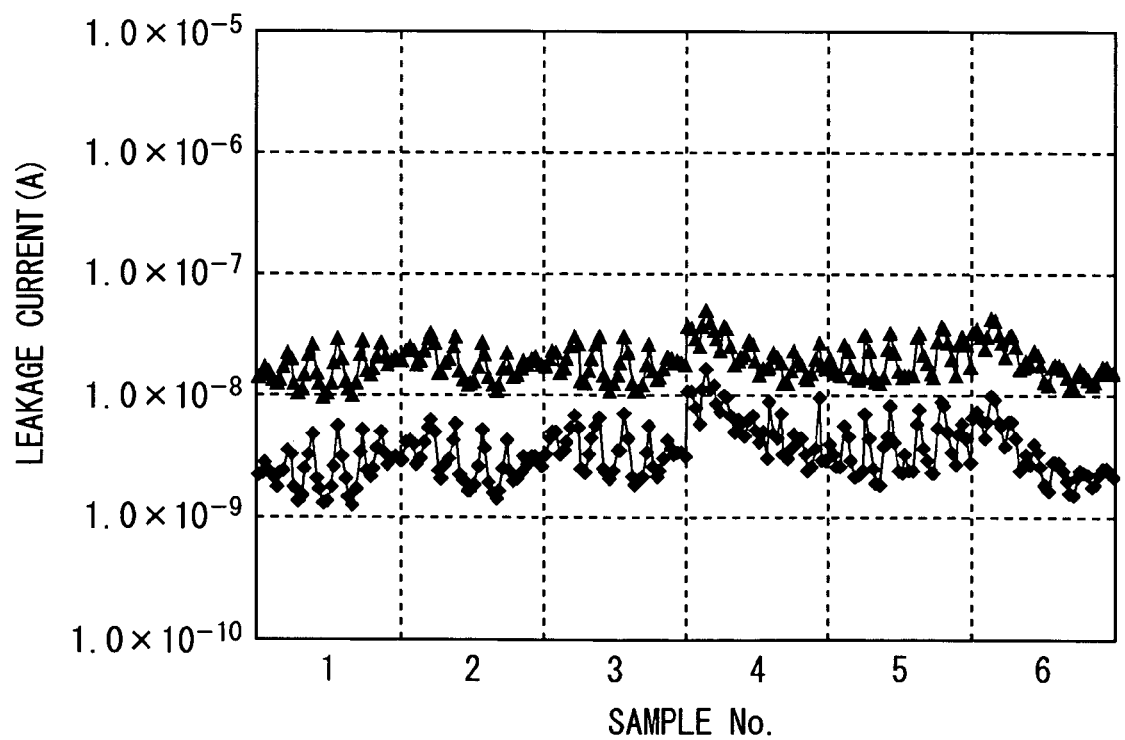
FIG. 4 is a graph showing leakage current.

As shown in FIG. 3, the switching charge amounts Qsw of samples No. 4 and No. 5 according to the embodiments were by no means inferior to the comparative examples. The fact that the switching charge amount Qsw of sample No. 1 according to the comparative example was lower than other samples was considered to be because the effect of the recovery annealing had been insufficient due to the relatively thick aluminum oxide film. Further, as shown in FIG. 4, the leakage current for samples No. 4 and No. 5 according to the embodiments were equal to those for the comparative examples.

Second Experiment

Also in the second experiment, samples were prepared according to six methods. A planar shape of the ferroelectric capacitor was set to be a rectangle 1.15 μm×1.80 μm. A ferroelectric capacitor of this size is generally used for a memory cell. The methods of preparing 6 kinds of samples were the same as the first experiment.

Figure 5:
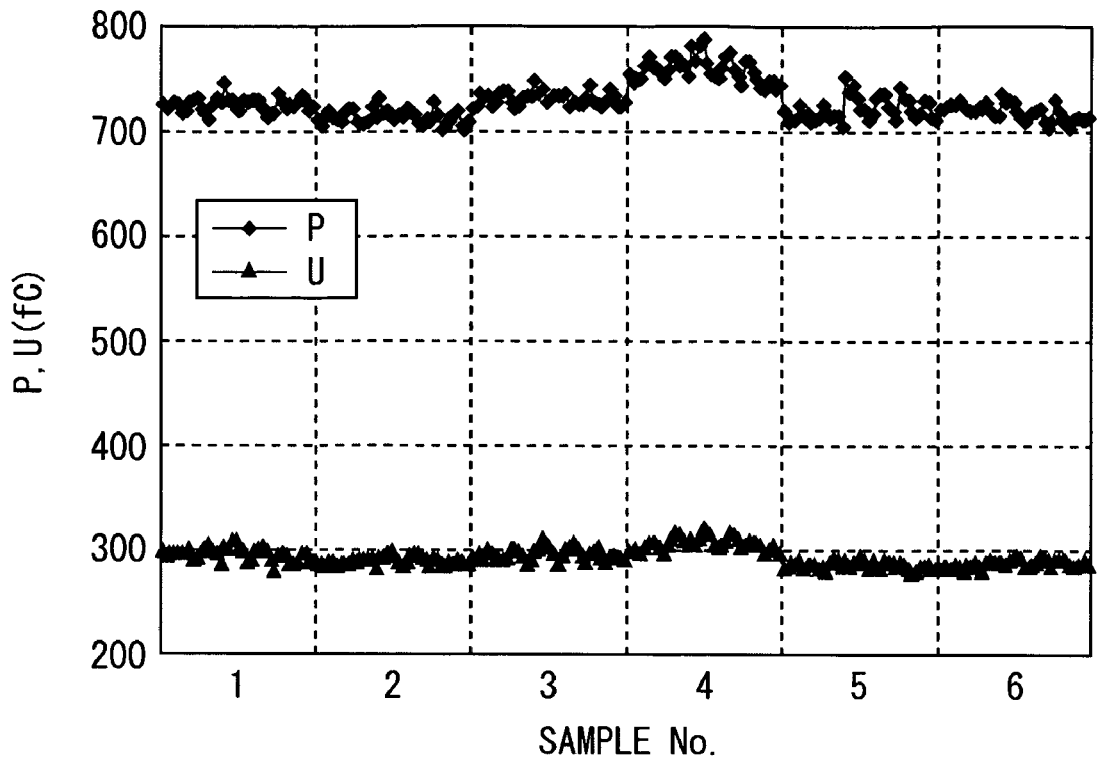
FIG. 5 is a graph showing P and U values in FIG. 7.
Figure 6:
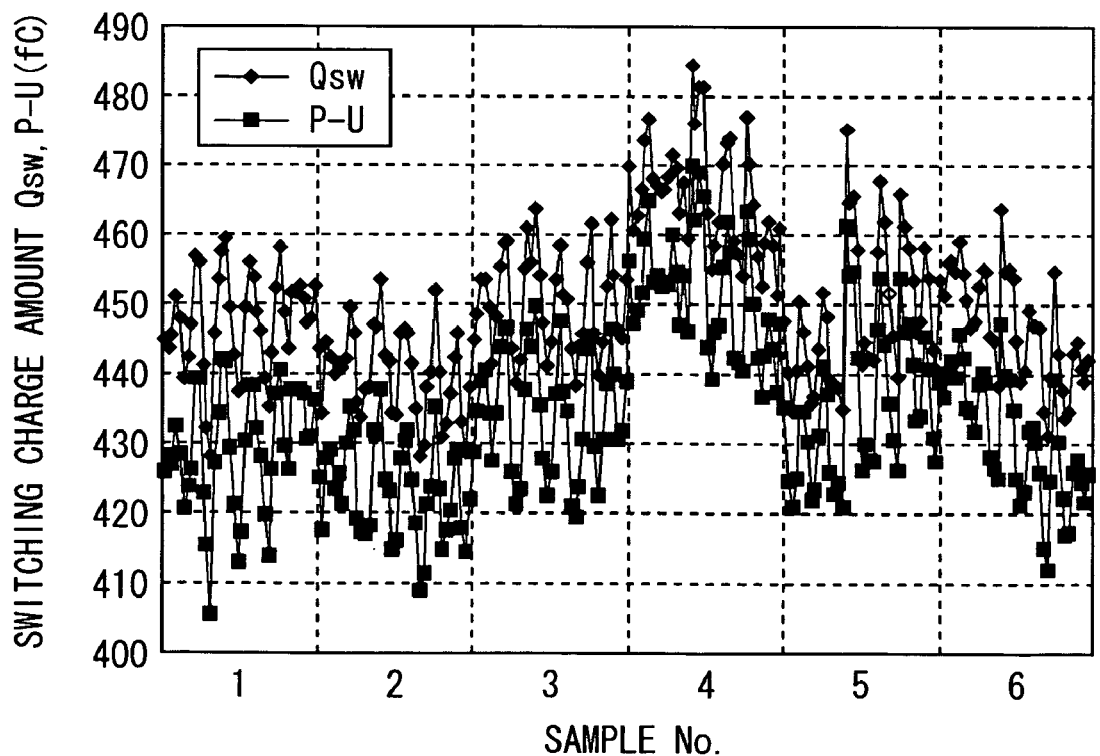
FIG. 6 is a graph showing the switching electric charge and P-U values.
Figure 7:
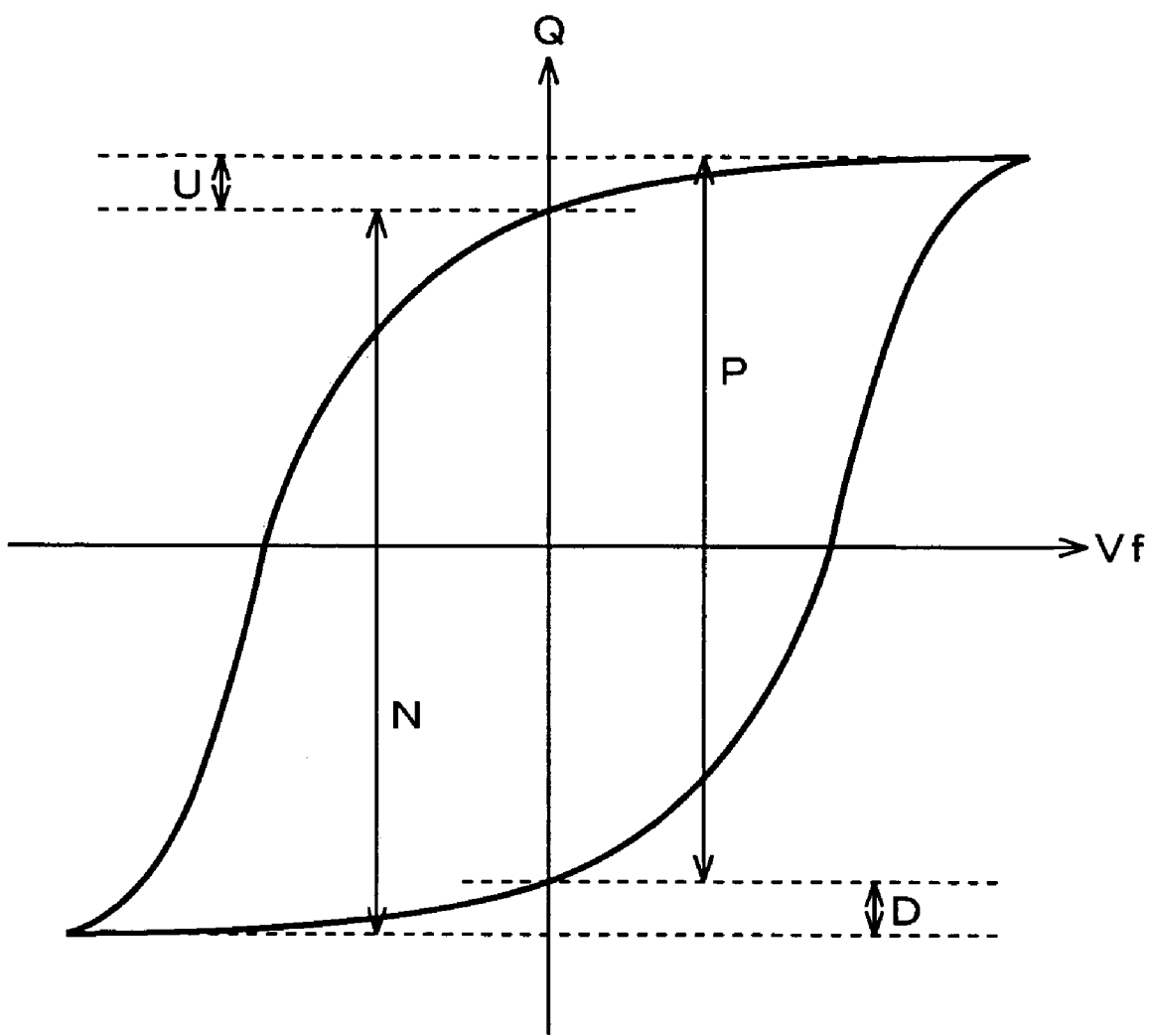
FIG. 7 is a graph showing a relation between applied voltage and an amount of polarization.

Hysteresis loops each showing a relation between applied voltage and amount of polarization as shown in FIG. 7 were determined for these samples, and from these hysteresis loops, various values were determined. These results are shown in FIGS. 5 and 6. Note that the switching charge amount Qsw is a value determined by the following Equation 1 using values P, U, N and D obtained from the hysteresis loops.

$$Qsw = \frac{(P-U)+(N-D)}{2} \quad \text{(Equation 1)}$$

As shown in FIGS. 5 and 6, in Sample No. 4, P and U values were higher than other samples, and the switching charge amount Qsw was remarkably higher than those of other samples. Especially, when compared with sample No. 6, the increase of the switching charge amount Qsw was about 8%. In sample No. 5, P value and U value were not so high as sample No. 4 when compared with the comparison examples, but the switching charge amount Qsw was high.

Note that the first embodiment can be applied to a ferroelectric capacitor having not a planar structure but a stacked structure.

Second Embodiment

Figure 8:
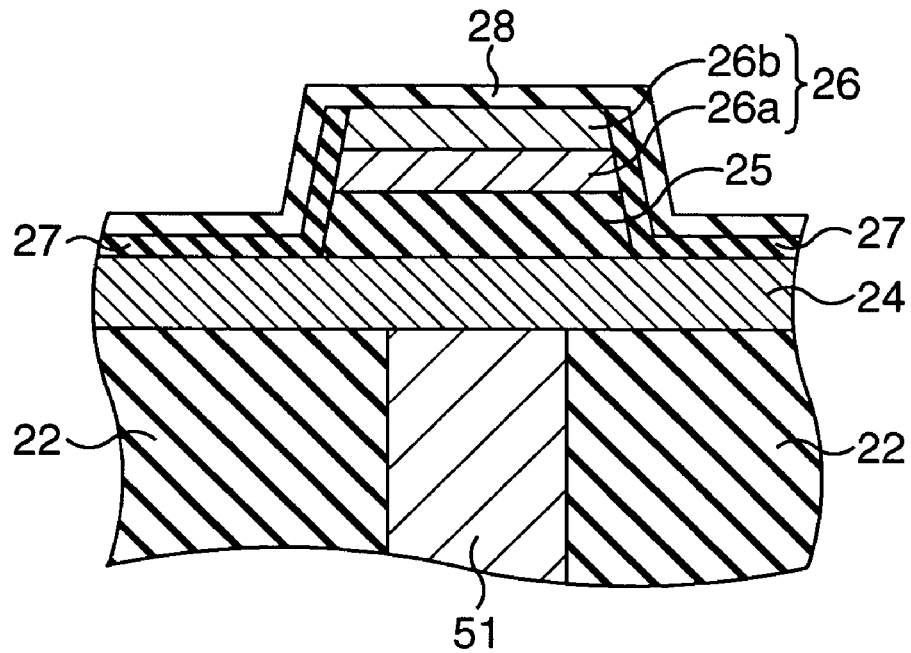
FIG. 8 is a sectional view showing a method of manufacturing the ferroelectric memory (semiconductor device) according to a second embodiment of the present invention.

Next, the second embodiment of the present invention will be explained. FIG. 8 is a sectional view showing a method of manufacturing a ferroelectric memory (semiconductor device) relating to the second embodiment of the present invention. A ferroelectric capacitor in a stacked structure is formed in the second embodiment.

In the second embodiment, after forming an interlayer insulating film 22, a contact hole is formed in the interlayer insulating film 22 and a conductive plug 51 is buried in the contact hole. Then, a Pt film 24 as a bottom electrode film, a PLZT film 25 as a ferroelectric film, and a top electrode film 26 composed of two $IrO_x$ films, are formed in sequence. Then, by patterning the top electrode film 26 and the PLZT film 25 collectively, a top electrode and a capacitor insulating film are formed. Thereafter, a PLZT film 27 is formed as an evaporation preventing film covering the top electrode film 26 and the PLZT film 25. Then, similarly to the first embodiment, recovery annealing is carried out in a state such that the sides of the PLZT film 25 are covered with the PLZT film 27. Next, the portion on the top electrode of the PLZT film 27 is removed. Then, an aluminum oxide film 28 is formed as a diffusion preventing film. Thereafter, the aluminum oxide film 28, the PLZT film 27, and the Pt film 24 are patterned to form a bottom electrode. Then, formation of an interlayer insulating film, formation of wiring for a ferroelectric capacitor in a stacked structure, and the like are carried out. Further, a cover film and the like are formed, so that a ferroelectric memory having the ferroelectric capacitor is completed.

Also in the second embodiment, since recovery annealing of the PLZT film 25 containing volatile Pb is carried out in a state such that the PLZT film 25 is covered with the PLZT film 27 being an evaporation preventing film, Pb loss of the PLZT is not created, similarly to the first embodiment. Accordingly, the compositional uniformity is maintained, and a favorable characteristic can be obtained.

Note that, it is possible to apply the second embodiment to the formation of a ferroelectric capacitor in a planar structure.

Third Embodiment

Figure 9:
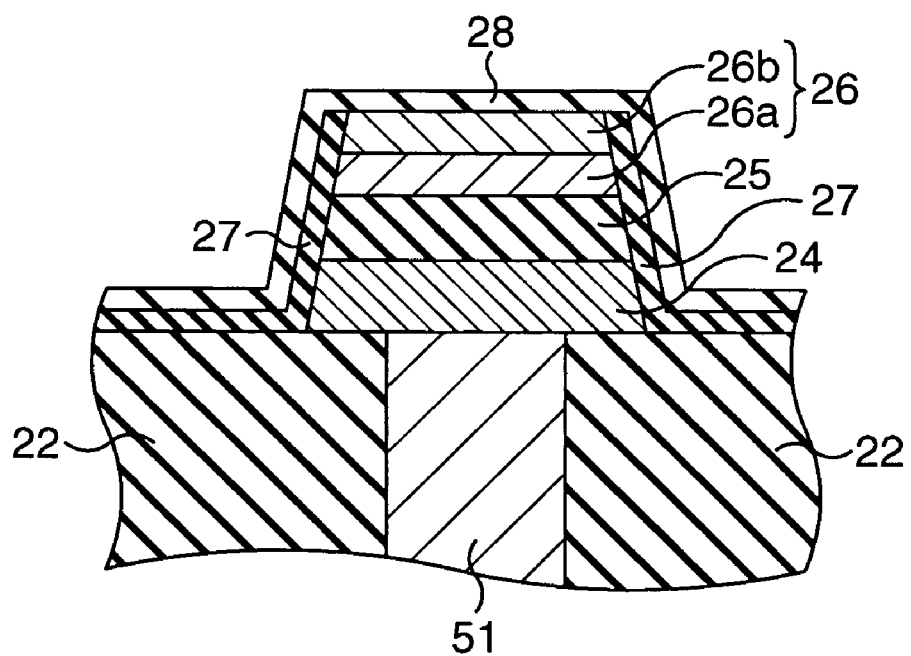
FIG. 9 is a sectional view showing a method of manufacturing the ferroelectric memory (semiconductor device) according to a third embodiment of the present invention.

Next, the third embodiment of the present invention will be explained. FIG. 9 is a sectional view showing a method of manufacturing a ferroelectric memory (semiconductor device) relating to the third embodiment of the present invention. In the third embodiment, similarly to the second embodiment, a ferroelectric capacitor in a stacked structure is formed.

In the third embodiment, after forming a Pt film 24 as a bottom electrode film, a PLZT film 25 as a ferroelectric film, and a top electrode film 26 composed of two $IrO_x$ films in sequence similarly to the second embodiment, by patterning the top electrode film 26, the PLZT film 25 and the Pt film 24 collectively, a top electrode, a capacitor insulating film, and a bottom electrode are formed. Next, a PLZT film 27 is formed as an evaporation preventing film covering the top electrode film 26, the PLZT film 25, and the bottom electrode. Then, similarly to the first and second embodiments, recovery annealing is carried out in a state such that the sides of the PLZT film 25 are covered with the PLZT film 27. Thereafter, the portion on the top electrode of the PLZT film 27 is removed. Then, an aluminum oxide film 28 is formed as a diffusion preventing film. Then, formation of an interlayer insulating film, formation of wiring for a ferroelectric capacitor in a stacked structure, and the like are carried out. Further, a cover film and the like are formed, so that a ferroelectric memory having the ferroelectric capacitor is completed.

Also in the third embodiment, since recovery annealing of the PLZT film 25 containing volatile Pb is performed in a state such that the PLZT film 25 is covered with the PLZT film 27 being an evaporation preventing film, no Pb loss in the PLZT film 25 is created similarly to the first and second embodiments. Accordingly, the compositional uniformity is maintained and a favorable characteristic can be obtained.

Note that the third embodiment can be applied to formation of a ferroelectric capacitor in a planar structure.

In these first to third embodiments, the portion on the top electrode of the PLZT film 27 is removed. This is because, when the wiring (plug) connected to the top electrode contains aluminum (Al), there is a possibility that contact between the wiring and the top electrode might be hindered by the PLZT film 27. However, when wiring (plug) connected to the top electrode does not contain aluminum (Al), for instance, a W plug, such a harmful effect is not created. Accordingly, in such a case, there is no need to provide a step aiming only at removing the portion on the top electrode of the PLZT film 27, or etching back the entire surface of the PLZT film 27. In this case, it is sufficient to form an opening in the PLZT film 27 during a series of steps in which a contact hole is formed in the interlayer film on the PLZT film 27.

Furthermore, as the ferroelectric film, it is also possible to use, other than the PLZT film, a PZT (Pb (Zr, Ti)) $O_3$) film, a Perovskite structured compound film such as a film prepared by adding a minute amount of Ca, Sr, Si or the like to the PZT film, or a Bi layered structured compound film such as SBT ($SrBi_2Ta_2O_9$) and the like. Further, a method of forming a ferroelectric film is not limited to any specific method; it is possible to form a ferroelectric film by a sol-gel method, a sputtering method, an MOCVD method or the like.

Further, materials for the top electrode film and the bottom electrode film are not limited. As the top electrode film, for example, an oxide film of Ir, Ru, Pt, Rh or Pd can be used, or a stacked body of these oxide films can be used. Furthermore, a stacked body which is structured by forming an $SrRuO_3$ film on these oxide films. As the bottom electrode, for example, a film made of Pt, Ir, Ru or Pd, or alloy films of these elements can be used, or a stacked body of these films can be used.

INDUSTRIAL APPLICABILITY

As described-above in detail, according to the present invention, it is possible to restrain compositional fluctuation of a capacitor insulating film due to heat treatment. Accordingly, even when sufficient recovery annealing is given, lowering of the switching characteristics can be restrained.

What is claimed is:

1. A method of manufacturing a semiconductor device, comprising the steps of:
   forming laminate composed of a bottom electrode film being a raw material film of a low electrode, a ferroelectric film being a raw material film of a capacitor insulating film and a top electrode film being a raw material film of the top electrode, of a ferroelectric capacitor;
   patterning at least said top electrode film;
   forming an evaporation preventing film covering an exposed portion of at least said ferroelectric film, said evaporation preventing film containing the same element as said ferroelectric film; and
   performing heat treatment for said ferroelectric film in an oxidative atmosphere so as to recover from sustained damage,
   wherein heat treatment is not performed between patterning said top electrode and forming said evaporation preventing film.

2. The method of manufacturing a semiconductor device according to claim 1, wherein
   a film containing an element which evaporates at a temperature at which said heat treatment to recover said ferroelectric film from damage is carried out is formed as said ferroelectric film, and
   a film containing said element is formed as said evaporation preventing film.

3. The method of manufacturing a semiconductor device according to claim 2, wherein said element is Pb.

4. The method of manufacturing a semiconductor device according to claim 1, further comprising a step of forming a diffusion preventing film to prevent diffusion of hydrogen into said ferroelectric film after the step of performing said heat treatment.

5. The method of manufacturing a semiconductor device according to claim 4, wherein an aluminum oxide film is formed as said diffusion preventing film.

6. The method of manufacturing a semiconductor device according to claim 1, wherein said top electrode film and ferroelectric film are patterned collectively in the step of patterning at least said top electrode film.

7. The method of manufacturing a semiconductor device according to claim 1, wherein said top electrode film, ferroelectric film and bottom electrode film are patterned collectively in the step of patterning at least said top electrode film.

8. The method of manufacturing a semiconductor device according to claim 1, further comprising a step of removing the portion on said top electrode film of said evaporation preventing film by patterning after the step of performing said heat treatment.

9. The method of manufacturing a semiconductor device according to claim 8, further comprising a step of forming a wiring connected to said top electrode and containing Al after the step of removing the portion of said evaporation preventing film.

10. The method of manufacturing a semiconductor device according to claim 1, further comprising a step of removing said evaporation preventing film by etch-back entire-surface after the step of performing said heat treatment.

11. The method of manufacturing a semiconductor device according to claim 10, further comprising a step of forming a wiring connected to said top electrode and containing Al after the step of removing the portion of said evaporation preventing film.

12. The method of manufacturing a semiconductor device according to claim 1, wherein said heat treatment is performed in an oxygen atmosphere.

13. The method of manufacturing a semiconductor device according to claim 1, wherein said heat treatment is performed at a temperature of 600° C. to 700° C.

14. The method of manufacturing a semiconductor device according to claim 1, wherein a conductive film containing a noble metal oxide is formed as said top electrode film.

15. The method of manufacturing a semiconductor device according to claim 14, wherein an oxide of one element selected from a group consisting of Ir, Ru, Pt, Rh and Pd is used as said noble metal oxide.

16. The method of manufacturing a semiconductor device according to claim 1, wherein a Perovskite structured compound film or a bismuth layered structured compound film is formed as said ferroelectric film.

17. The method of manufacturing a semiconductor device according to claim 1, wherein a film selected from a group consisting of an Ir film, a Ru film, a Pt film and a Pd film is formed as said bottom electrode film.

18. The method of manufacturing a semiconductor device according to claim 1, wherein an oxide film containing one element selected from a group consisting of Ir, Ru, Pt and Pd is formed as said bottom electrode film.

19. The method of manufacturing a semiconductor device according to claim 1, wherein said ferroelectric film is formed by a sol-gel method, a sputtering method or an MOCVD method.

* * * * *